United States Patent [19]

Kuhnert et al.

[11] Patent Number: 5,436,502
[45] Date of Patent: Jul. 25, 1995

[54] SEMICONDUCTOR COMPONENT AND METHOD FOR THE MANUFACTURING THEREOF

[75] Inventors: Reinhold Kuhnert, Munich; Peter Tuerkes, Unterhaching, both of Germany

[73] Assignee: Siemens Aktiengesellschaft, Munich, Germany

[21] Appl. No.: 327,220

[22] Filed: Oct. 21, 1994

Related U.S. Application Data

[60] Continuation of Ser. No. 153,973, Nov. 18, 1993, abandoned, which is a division of Ser. No. 22,878, Feb. 25, 1993, Pat. No. 5,300,458, which is a continuation of Ser. No. 884,142, May 18, 1992, abandoned.

[30] Foreign Application Priority Data

Jun. 24, 1991 [DE] Germany ............ 41 20 827.7

[51] Int. Cl.[6] .................... H01L 23/02; H01L 29/74
[52] U.S. Cl. .................... 257/717; 257/180; 257/181; 257/720
[58] Field of Search .......... 257/177, 180, 181, 713, 257/717, 720

[56] References Cited

U.S. PATENT DOCUMENTS

| | | | |
|---|---|---|---|
| 3,343,048 | 9/1967 | Kuehn et al. | 257/177 |
| 3,928,093 | 12/1975 | van Tongerboo et al. | 257/177 |
| 4,607,779 | 8/1986 | Burns | 228/180.2 |
| 4,657,170 | 4/1987 | Muller | 228/106 |
| 4,764,809 | 8/1988 | Sahara et al. | 437/221 |
| 4,810,672 | 3/1989 | Schwarzbauer | 437/209 |
| 4,848,639 | 7/1989 | Belanger, Jr. | 228/106 |
| 4,868,636 | 9/1989 | Gross | 257/177 |
| 4,903,885 | 2/1990 | Schwarzbauer | 228/243 |
| 4,903,886 | 2/1990 | Schwarzbauer | 228/106 |
| 5,073,521 | 12/1991 | Braden | 437/209 |
| 5,081,067 | 1/1992 | Shimizu et al. | 437/215 |

FOREIGN PATENT DOCUMENTS

| | | | |
|---|---|---|---|
| 0242626B1 | 10/1987 | European Pat. Off. | H01L 23/48 |
| 2636777 | 3/1990 | France | H01L 23/36 |
| 3731624A1 | 3/1989 | Germany | H01L 23/34 |
| 54-57976 | 5/1979 | Japan | 257/177 |
| 57-78173 | 5/1982 | Japan | 257/177 |
| 59-208758 | 11/1984 | Japan | 257/177 |
| 62-79669 | 4/1987 | Japan | 257/177 |

OTHER PUBLICATIONS

8011 Brown Boveri Review, 74 (1987) Nov., No. 11, Baden, Switzerland; P. Leipold et al. "Reliability Tests for Power Semiconductor Modules", pp. 613–619.

Primary Examiner—Ngân V. Ngô
Attorney, Agent, or Firm—Hill, Steadman & Simpson

[57] ABSTRACT

A semiconductor component comprises a semiconductor body that has its underside secured on a metallic substrate and is joined at its upper side to an auxiliary member composed of a material having great thermal conductivity and which serves as a heat buffer. This auxiliary member increases the loadability of the semiconductor component with respect to additional, thermal stressing pulses.

7 Claims, 2 Drawing Sheets

SEMICONDUCTOR COMPONENT AND METHOD FOR THE MANUFACTURING THEREOF

This is a continuation of application Ser. No. 08/153,973, filed Nov. 18, 1993, now abandoned, which is a division of application Ser. No. 08/022,878, filed Feb. 25, 1993, now U.S. Pat. No. 5,300,458, which is a continuation of application Ser. No. 07/884,142, filed May 18, 1992, now abandoned.

BACKGROUND OF THE INVENTION

The invention is directed to a semiconductor component comprising a semiconductor body that has its underside secured on a metallic substrate.

For example, EP-A-0 242 626 discloses a semiconductor component of this type. One must thereby often proceed on the basis of a brief-duration thermal stressing that is present, for instance, given employment of such a component as a switch in a load circuit. Such a pulse-shaped stressing, however, can lie above the admissiblt continuous load without a destruction of the component occurring as a result thereof insofar as the thermal stressing pulses lead to a temperature of the semiconductor component that does not even briefly exceed a maximum value.

SUMMARY OF THE INVENTION

An object of the invention is to specify a semiconductor component of the type initially cited whose pulse-shaped thermal loadability lies significantly above that of traditional components of this type, or whose heating given comparable thermal loads is significantly less than that of the known components. According to the invention, a semiconductor component comprises a semiconductor body having its underside secured on a metallic substrate and wherein an auxiliary member formed of a material having a great thermal conductivity and serving as a heat buffer is applied on an upper side of the semiconductor body. A joining layer is provided between the upper side of the semiconductor body and the under side of the auxiliary member. This joining layer guarantees an extremely low thermal contact resistance between the semiconductor body and the auxiliary member. In a method for manufacturing a semiconductor component according to the invention, an auxiliary member is joined with a semiconductor body using a pressure sintering method wherein a paste formed of a metal powder and of a solvent is applied on the upper side of the semiconductor body provided with a contacting layer, or is applied on an underside of the auxiliary member. The applied paste is then dried. The auxiliary member is then placed with its underside on the upper side of the semiconductor body and this arrangement is pressed together at a sintering temperature with a pressure of at least 900 N/cm$^2$. Also in a method of the invention, a semiconductor component is manufactured such that an auxiliary member is joined to the semiconductor body with a diffusion welding method. The upper side of the semiconductor body and an under side of the auxiliary member are each provided with a contacting layer. The auxiliary member is then placed with its under side on the upper side of the semiconductor body, and this arrangement is then pressed together at a moderate temperature with at least approximately 500 kp/cm$^2$.

The advantage obtainable with the invention is particularly comprised in that the heating of the semiconductor component based on the thermal stressing pulses is significantly lower than in traditional components, so that either a higher pulse-shaped, thermal stressing or a higher continuous operating temperature can be allowed in comparison to the latter.

DESCRIPTION OF THE PREFERRED EMBODIMENTS

Figure 1:
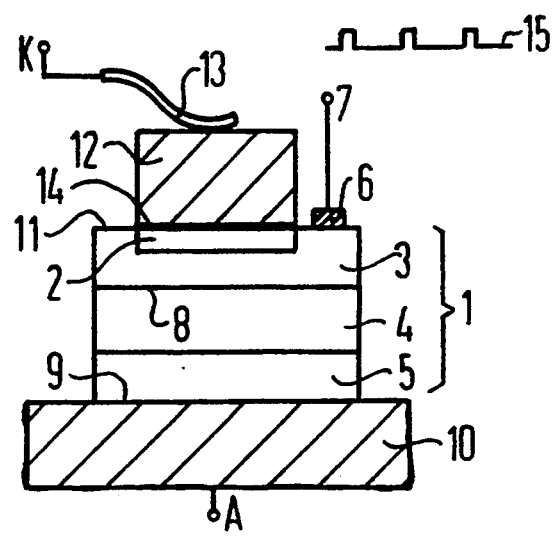
FIG. 1 is a first exemplary embodiment of the invention.

FIG. 1 shows the semiconductor body i of a semiconductor component in section. This, for example, is a matter of a thyristor that comprises a vertical npnp layer sequence. The individual layers are referred to as n-emitter 2, p-base 3, n-base 4 and p-emitter 5. The p-base 3 is provided with a gate contact 6 that comprises a terminal 7 for supplying an ignition current pulse. A pn-junction separating the p-base 3 from the n-base 4 is referenced 8. The semiconductor body 1 has its underside 9 secured to a metallic substrate 10 that, for example, is composed of molybdenum and is provided with a terminal A at the anode side. A block-shaped auxiliary member 12 that is composed of a metal having a high thermal conductivity and that serves as a heat buffer is attached to the upper side 11 of body 1. It can be particularly advantageously fabricated of copper, tungsten, or molybdenum. The auxiliary member 12 in FIG. 1 is designed as an electrode contacting the n-emitter 2 and is connected to a lead 13 of the cathode side that is provided with a terminal K at the cathode side.

A connecting layer 14 that guarantees an extremely low thermal contact resistance between the n-emitter 2 and the auxiliary member 12 is provided between the upper side 11 of the semiconductor body 1 and the underside of the auxiliary member 12. This preferably involves a silver layer that arises with a pressure sintering method when joining the parts 1 and 12. On the other hand, the connecting layer 14 can also be formed of the contacting layers that are respectively applied onto the surfaces to be joined to one another given employment of a diffusion welding method for joining the parts 1 and 12. Pressure sintering and diffusion welding processes that can be advantageously utilized for joining the parts 1 and 12 are set forth in greater detail later.

When the thyristor 1 is situated in a load circuit connected at A and K that contains a load resistor in addition to containing an alternating voltage source, and when the terminal 7 is supplied with a periodic sequence of ignition current pulses 15, then the thyristor 1 switches into the transmissive condition wherein the arrangement 10, 1, 12 is traversed by a load current at every appearance of each and every individual ignition current pulse. The thyristor I is in turn quenched at the appearance of the zero-axis crossing of the alternating voltage that follows every ignition current pulse, so that a sequence of load current pulses arises whose repetition rate is defined by the ignition current pulses 15. The load current pulses then yield a periodic, pulse-shaped thermal stressing of the arrangement composed of the parts 1, 10 and 12 that leads to a constant basic temperature of the arrangement. As a result of the auxiliary member 12 that represents a heat buffer, the thermal capacity of this arrangement is so high that the additional heating of the thyristor 1 given the occurrence of additional thermal stressing pulses is significantly lower than in comparable, traditional thyristors that are only composed of the parts 1 and 10. A pulse-shaped thermal stressing that is higher than in traditional thyristors can therefore also be allowed given the arrangement of FIG. 1, without a prescribed, maximum component temperature being upwardly exceeded. For example, this means that the duration of the individual stressing pulses can become longer than was hitherto possible. Given an identical duration of the stressing pulses, on the other hand, the heat released therein can become greater without the maximum component temperature being upwardly exceeded.

The designing of the auxiliary member 12 shown in FIG. 1 as a large-area electrical contact contributes to the homogenization of the load current flowing between A and K. Moreover, the lead 13 connected to the auxiliary member 12 can be designed with an adequately large cross section so that the multiple bonding methods standard given high load currents wherein a plurality of thin leads that are parallel to one another are connected to one and the same electrode structure is avoided.

Figure 2:
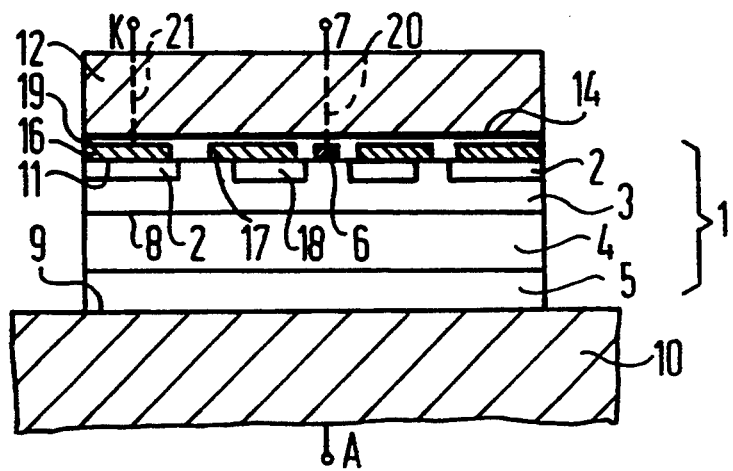
FIG. 2 is a second exemplary embodiment.

Whereas the auxiliary member 12 in the exemplary embodiment shown in FIG. 1 is designed as a large-area electrode that contacts a current-carrying region of the upper side 11 of the semiconductor body 1, FIG. 2 shows a thyristor wherein large-area, conductive coats are provided on the upper side of the semiconductor body 1, so that an electrode-like designing of the auxiliary member in the region of these coats does not come into consideration. In detail, the conductive coats are composed of a cathode-side electrode 16 that contacts the n-emitter 2, of a coat 17 that contacts an n-conductive region 18 inserted into the p-base 3, and forms an auxiliary emitter (amplifying gate) in conjunction therewith that represents an internal ignition intensification of the thyristor, and of the centrally arranged gate electrode 6. The auxiliary member 12 here is secured on a thin insulating layer 19 that electrically insulates the conductive coats 6, 16 and 17 and that is preferably composed of silicon nitride ($Si_3N_4$) or of amorphous carbon. The connecting layer 14 is also situated between the auxiliary member 12 and the thin insulating layer 19, this connecting layer 14 being particularly formed of a silver layer when utilizing a pressure sintering method for joining the parts 1 and 12, or arising from two contacting layers that are respectively applied onto the upper side of the thin insulating layer 19 and onto the underside of the auxiliary member 12 before the implementation of a diffusion welding process. The connecting layer 14 thereby sees to a thermal contact resistance between the parts 1 and 12 that is in fact greater than that in the thyristor of FIG. 1, but that can still be compensated. The leads 20 and 21 to the parts 6 and 16 are located in front of or behind the auxiliary member 12, this being indicated by their broken-line path, and they are provided with the terminals 7 and K.

Figure 3:
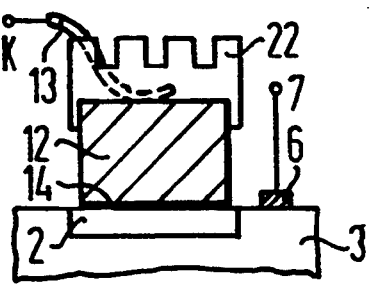
FIG. 3 is a development of the exemplary embodiment of FIG. 1.

FIG. 3 shows a development of the semiconductor component of FIG. 1 wherein the auxiliary member 12 is provided with a plugged-on cooling plate 22. The DC loadability of the semiconductor component is increased as a result thereof.

Figure 4:
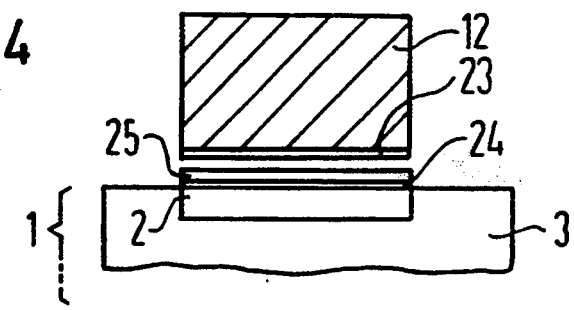
FIG. 4 is an illustration for explaining a first manufacturing method for a semiconductor component of the invention.

In a semiconductor component of FIG. 1, the joining of the parts 1 and 12 preferably occurs according to a known method of low-temperature joining technology referred to as pressure sintering that is set forth in greater detail with reference to FIG. 4. The auxiliary member 12 thereby has at least its underside provided with an electro-deposited contacting layer 23 that is approximately 2 through 3 $\mu$m thick and, for example, is composed of silver. The upper side of the semiconductor body 1 is covered in the region of the n-emitter 2 with a layer sequence that is composed of an approximately 1 $\mu$m thick aluminum layer, of an approximately 100 nm thick titanium layer applied thereabove, of an approximately 500 nm thick middle layer of, for example, nickel or platinum lying over this titanium layer, and finally, of an approximately 200 nm thick silver layer lying over this middle layer. Only the silver layer serving as a contacting layer is shown in FIG. 4; it is referenced 24. Subsequently, a paste 25 is applied in layer-like fashion onto the contacting layer 24, namely with a layer thickness from approximately 10 to 100 $\mu$m, and preferably approximately 20 $\mu$m. Silver powder that is suspended in cyclohexanol as a solvent is employed as an initial material for producing the paste 25. Subsequently, the paste produced in this way is degasified in a vacuum in order to avoid the formation of bubbles when drying.

After drying the paste 25, the auxiliary member 12 has its contacting layer 23 put in place on the contacting layer 24 of the semiconductor body 1 covered by the paste 25, and the arrangement composed of the parts 1 and 12 is brought to a sintering temperature of, for example, 230° C. At this temperature, a pressure of at least 900 $N/cm^2$ is exerted onto the arrangement 1, 12 over a sintering time of approximately 1 minute. However, it must be pointed out that an adequate joining of the parts is already achieved given sintering times of a few seconds, and that the pressure can also be increased to 1 through 2 $t/cm^2$. The sintering temperature can lie in a range that has a lower limit value of approximately 150° C. and an upper limit value of approximately 250° C. Further, it must be emphasized that pressure sintering is undertaken in a normal atmosphere, i.e. it is not necessary to employ a protective gas. The paste 25 can also be additionally or exclusively applied onto the contacting layer 23.

Figure 5:
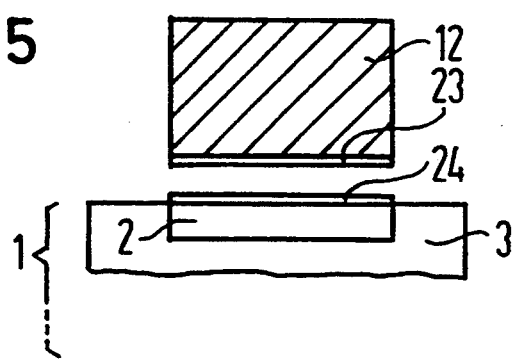
FIG. 5 is an illustration for explaining a second manufacturing method for a semiconductor component of the invention.

A further method of low-temperature joining technology that is suitable for joining the parts 1 and 12 is diffusion welding that is set forth with reference to FIG. 5. The auxiliary member 12 thereby has its underside provided with the contacting layer 23, whereas the upper side of the semiconductor body 1 is provided with a precious metal contacting layer 24 in the region of the n-emitter 2, this layer 24 being preferably composed of gold or silver. It is advantageous to provide metallic intermediate layers, for example of Al, Ag, Cu or Au, having a layer thickness of approximately 10 to 20 $\mu$m under the contacting layer 24. These intermediate layers are plastically deformable in order to compensate the surface roughnesses of the surfaces to be joined to one another. When the intermediate layers are composed of precious metal, the contacting layer 24 can also be omitted since it is replaced by the intermediate layer in this case. The parts 1 and 12 coated in this way are now placed on one another such that the underside of the auxiliary member 12 contacts the contacting layer 24 of the semiconductor body. Subsequently, the parts 1 and 12 are brought to a temperature that lies approximately in the range from 150° through 250° C., i.e. into a moderate temperature range that is comparable to the operating temperature of a power semiconductor. These parts are thereby pressed together with a pressing power of approximately 500 to 2500 Kp/cm² or more over a diffusion time of a few minutes. However, even given diffusion times of only a few seconds, adequate results are already achieved. On the other hand, the pressure can be increased to more than 2.5 t/cm². Diffusion welding also preferably occurs in a normal atmosphere without the employment of a protective gas.

Figure 6:
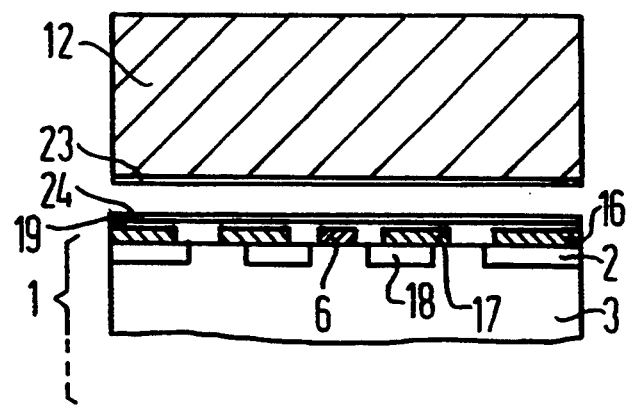
FIG. 6 is an illustration for explaining an additional method step in the manufacture of a semiconductor component of FIG. 2.

In the manufacture of a semiconductor component of FIG. 2, FIG. 6 shows that the thin insulating layer 19 that is then coated with the contacting layer 24 and that covers the conductive coats 6, 16 and 17 is first applied onto the upper side of the semiconductor body 1. The joining of the semiconductor body 1 coated to this extent to the auxiliary member 12 provided with a contacting layer 23 subsequently follows, namely either in the diffusion welding process or upon employment of the paste 25 using the pressure sintering process.

The joining of the parts 1 and 12, for example, can also occur on the basis of a soldering process wherein a lead/tin solder is advantageously employed.

The invention is generally employable in all semiconductor components that are monolithically integrated in a semiconductor body, for example for diodes, thyristors, power transistors, power MOSFETs, IGBTs, etc. The drawings can be utilized, for example, for the illustration of diodes when the semiconductor body 1 comprises respectively only one pn-junction 8 that separates an n-conductive region lying thereabove from a p-conductive region lying therebelow. The gate electrode 6 and the conductive coats 16 and 17 are then thereby omitted.

Although various minor changes and modifications might be proposed by those skilled in the art, it will be understood that we wish to include within the claims of the patent warranted hereon all such changes and modifications as reasonably come within our contribution to the art.

We claim as our invention:

1. A semiconductor component, comprising:
   a semiconductor body having its underside secured on a metallic substrate;
   an auxiliary member formed of a material having a relatively great thermal conductivity and serving as a heat conductor applied on an upper side of said semiconductor body; and
   a relatively thin electrically insulating layer on the upper side of the semiconductor body directly followed by and in abutting direct contact with a relatively high heat conductivity joining layer structure attached to an underside of said auxiliary member, said insulating layer extending across the upper side of the semiconductor body so as to completely insulate all portions of the semiconductor body from the joining layer and auxiliary member, said joining layer structure combined with said relatively thin electrically insulating layer providing a relatively extremely low thermal contact resistance and an electrical insulation between the upper side of the semiconductor body and the underside of the auxiliary member.

2. A semiconductor component according to claim 1 wherein said auxiliary member comprises a metal formed of an element selected from the group consisting of copper, tungsten, and molybdenum.

3. A semiconductor component according to claim 1 wherein said thin electrically insulating layer comprises silicon nitride.

4. A semiconductor component according to claim 1 wherein said thin electrically insulating layer comprises an amorphous carbon layer.

5. A semiconductor component according to claim 1 wherein said auxiliary member is provided with an attached cooling plate.

6. A semiconductor component according to claim 1 wherein said joining layer structure comprises a metal layer on said auxiliary member in intimate abutting contact with another metal layer on said thin electrically insulating layer.

7. A semiconductor component, comprising:
   a semiconductor body having its underside secured on a substrate, said semiconductor body having at least one electrical contact;
   an insulating layer on an upper side of said semiconductor body;
   a high heat conductivity layer structure directly on and in abutting contact with said insulating layer;
   said insulating layer extending across the upper side of the semiconductor body so as to completely insulate the semiconductor body and the at least one electrical contact thereof from the high heat conductivity layer structure;
   an auxiliary member formed of a metal having a relatively great thermal conductivity and serving as a heat conductor applied on said high heat conductivity layer structure; and
   a thickness of the insulating layer being chosen sufficiently thin to provide a relatively extremely low thermal contact resistance between the auxiliary member and the upper side of the semiconductor body.

* * * * *